(12) United States Patent
Van Der Wilk et al.

(10) Patent No.: US 10,133,196 B2
(45) Date of Patent: Nov. 20, 2018

(54) APPARATUS FOR CLEANING AN OBJECT

(71) Applicant: ASML Netherlands B.V., Veldhoven (NL)

(72) Inventors: Ronald Van Der Wilk, Knegsel (NL); Ger-Wim Jan Goorhuis, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 54 days.

(21) Appl. No.: 15/302,146

(22) PCT Filed: Mar. 2, 2015

(86) PCT No.: PCT/EP2015/054277
§ 371 (c)(1),
(2) Date: Oct. 5, 2016

(87) PCT Pub. No.: WO2015/154917
PCT Pub. Date: Oct. 15, 2015

(65) Prior Publication Data
US 2017/0205717 A1 Jul. 20, 2017

(30) Foreign Application Priority Data

Apr. 9, 2014 (EP) ..................................... 14164043

(51) Int. Cl.
*G03F 7/20* (2006.01)
(52) U.S. Cl.
CPC ................................ *G03F 7/70925* (2013.01)
(58) Field of Classification Search
CPC ............ G03F 7/70925; G03F 7/70708; H01L 21/6831
See application file for complete search history.

(56) References Cited

U.S. PATENT DOCUMENTS

| 3,868,271 A | 2/1975 | Poley et al. |
| 4,883,437 A | 11/1989 | Hernqvist |

(Continued)

FOREIGN PATENT DOCUMENTS

| CN | 1487360 | 4/2004 |
| EP | 1 329 773 | 7/2003 |

(Continued)

OTHER PUBLICATIONS

International Search Report and Written Opinion dated Jul. 3, 2015 in corresponding International Patent Application No. PCT/EP2015/054277.

(Continued)

*Primary Examiner* — Steven H Whitesell Gordon
(74) *Attorney, Agent, or Firm* — Pillsbury Winthrop Shaw Pittman LLP

(57) ABSTRACT

An apparatus for cleaning an object, the apparatus including: an object support for supporting the object; a low pressure chamber for exposing a first surface of the object to a low pressure when the object is arranged on the object support, an electrode arranged adjacent to and separated from the first surface of the object when the object is arranged on the object support, the electrode being in electrical communication with a surface of the object support which is adjacent the first surface of the object; and a power supply arranged to apply a voltage between the electrode and the object; thereby generating a discharge between the object and the electrode.

22 Claims, 2 Drawing Sheets

(56) References Cited

U.S. PATENT DOCUMENTS

| | | |
|---|---|---|
| 4,935,115 A | 6/1990 | Chambaere et al. |
| 5,393,575 A | 2/1995 | Esterlis |
| 5,779,807 A | 7/1998 | Dornfest et al. |
| 5,880,924 A * | 3/1999 | Kumar ............... H01L 21/6831 |
| | | 279/128 |
| 5,938,854 A * | 8/1999 | Roth .................... B08B 7/0035 |
| | | 134/1 |
| 5,948,294 A | 9/1999 | Gordon |
| 7,092,231 B2 | 8/2006 | Hoeks et al. |
| 2001/0026781 A1 | 10/2001 | Aigner et al. |
| 2009/0033889 A1* | 2/2009 | Bleeker .............. G03F 7/70866 |
| | | 355/30 |
| 2011/0037960 A1* | 2/2011 | Scaccabarozzi .... G03F 7/70925 |
| | | 355/30 |

FOREIGN PATENT DOCUMENTS

| | | |
|---|---|---|
| GB | 595392 | 12/1947 |
| JP | H11-297595 | 10/1999 |
| WO | 2013/113568 | 8/2013 |

OTHER PUBLICATIONS

European Office Action dated Aug. 2, 2017 in corresponding European Patent Application No. 15709638.9.
Chinese Office Action dated Nov. 14, 2017 in corresponding Chinese Patent Application No. 201580018680.2.

* cited by examiner

APPARATUS FOR CLEANING AN OBJECT

CROSS-REFERENCE TO RELATED APPLICATIONS

This application is the U.S. national phase entry of PCT patent application no. PCT/EP2015/054277, which was filed on Mar. 2, 2015, which claims the benefit of priority of EP application no. 14164043.3, which was filed on Apr. 9, 2014 and which is incorporated herein in its entirety by reference.

FIELD

The present invention relates to an apparatus and method for cleaning an object, for example an object which is to be held by an electrostatic clamp, and a lithographic apparatus containing such an apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate.

The wavelength of radiation used by a lithographic apparatus to project a pattern onto a substrate determines the minimum size of features which can be formed on that substrate. A lithographic apparatus which uses EUV radiation, being electromagnetic radiation having a wavelength within the range 4-20 nm, may be used to form smaller features on a substrate than a conventional lithographic apparatus (which may for example use electromagnetic radiation with a wavelength of 193 nm).

Electrostatic clamps may be used in lithographic apparatuses operating at certain wavelengths, e.g. EUV, since at these wavelengths, certain regions of the lithographic apparatus operate under vacuum conditions. An electrostatic clamp may be provided to electrostatically clamp (i.e. hold) an object, such as a mask or a substrate (wafer) to an object support, such as a mask table or a wafer table, respectively.

The voltage which is applied to an electrostatic clamp may be considerable. For example, the voltage may be of the order of kilovolts. An insulating barrier is conventionally located over an electrode of an electrostatic clamp, the insulating barrier acting to insulate an object such as a substrate from the voltage applied to the electrode.

It is desirable to provide, for example, an apparatus and method which obviates or mitigates one or more of the problems of the prior art, whether identified herein or elsewhere.

SUMMARY

According to a first an aspect of the invention there is provided an apparatus for cleaning an object, the apparatus comprising: an object support for supporting the object; a low pressure chamber for exposing a first surface of the object to a low pressure when the object is arranged on the object support, an electrode arranged adjacent to and separated from the first surface of the object when the object is arranged on the object support, the electrode being in electrical communication with a surface of the object support which is adjacent the first surface of the object; and a power supply arranged to apply a voltage between the electrode and the object; thereby generating a discharge between the object and the electrode.

The generation of a discharge (e.g. an electric discharge), between the object and the electrode causes small particles or scratches on the surface of the object to be modified or removed such that they do not act as electron emitters when the object is subsequently clamped by an electrostatic clamp. This cleaning of the surface of the object, and resulting reduction in electron emission, slows down any charge accumulation on an electrostatic clamp. This reduction in the rate of charge accumulation can increase the time between maintenance operations on the clamp and improve clamping performance (e.g. clamping force uniformity).

The electrode being in electrical communication with the surface of the object support allows any electrons emitted from the surface of the object and incident upon the surface of the object support to be carried away from the surface of the object support, rather than becoming trapped, as they would if the surface was an insulating surface (e.g. as is the case with a conventional electrostatic clamp).

The object support may be arranged to support the object within the chamber.

The electrode may be provided with a resistive layer on the surface of the object support which is adjacent the first surface of the object.

The provision of a resistive layer limits the instantaneous current which can flow between the object and the electrode to a level which is not damaging to the object, while still ensuring that electrons can be carried away from the surface of the object support.

The resistive layer may have a resistance of greater than around $10^5 \Omega$.

The resistive layer may have a resistance of less than around $10^{12} \Omega$.

The resistive layer may have a resistivity of greater than around $10^6 \, \Omega \cdot m$.

The resistive layer may have a resistivity of less than around $10^{14} \, \Omega \cdot m$.

The magnitude of the voltage may be greater than about 200 V.

The magnitude of the voltage may be less than about 1000 V.

The separation between the object support and the first surface of the object when the object is arranged on the object support may be greater than about 5 mm.

The separation between the object support and the first surface of the object when the object is arranged on the object support may be less than about 20 mm.

The apparatus may further comprise a second electrode, wherein a power supply is arranged to apply a first voltage between the first electrode and the object and a second voltage between the second electrode and the object.

The second voltage may be of opposite sign to the first voltage.

The second voltage may be of substantially equal magnitude to the first voltage.

The low pressure may be less than about 100 mbar.

The low pressure may be greater than about 1 mbar.

According to a second aspect of the invention there is provided a lithographic tool comprising an apparatus according to the first aspect of the invention.

The low pressure chamber may be a load lock of the lithographic tool.

According to a third aspect of the invention there is provided a method of cleaning an object, the method comprising: providing the object to be cleaned; supporting the object; exposing a first surface of the object to be cleaned to a low pressure; providing an electrode adjacent to and separated from the first surface of the object; applying a voltage between the electrode and the object so as to generate a discharge between the object and the electrode; and providing a current path between the electrode and the first surface of the object.

Features and advantages described with reference to one aspect of the invention can be used with other aspects of the invention.

BRIEF DESCRIPTION OF THE DRAWINGS

Embodiments of the invention will now be described, by way of example only, with reference to the accompanying schematic drawings, in which.

DETAILED DESCRIPTION

Figure 1:
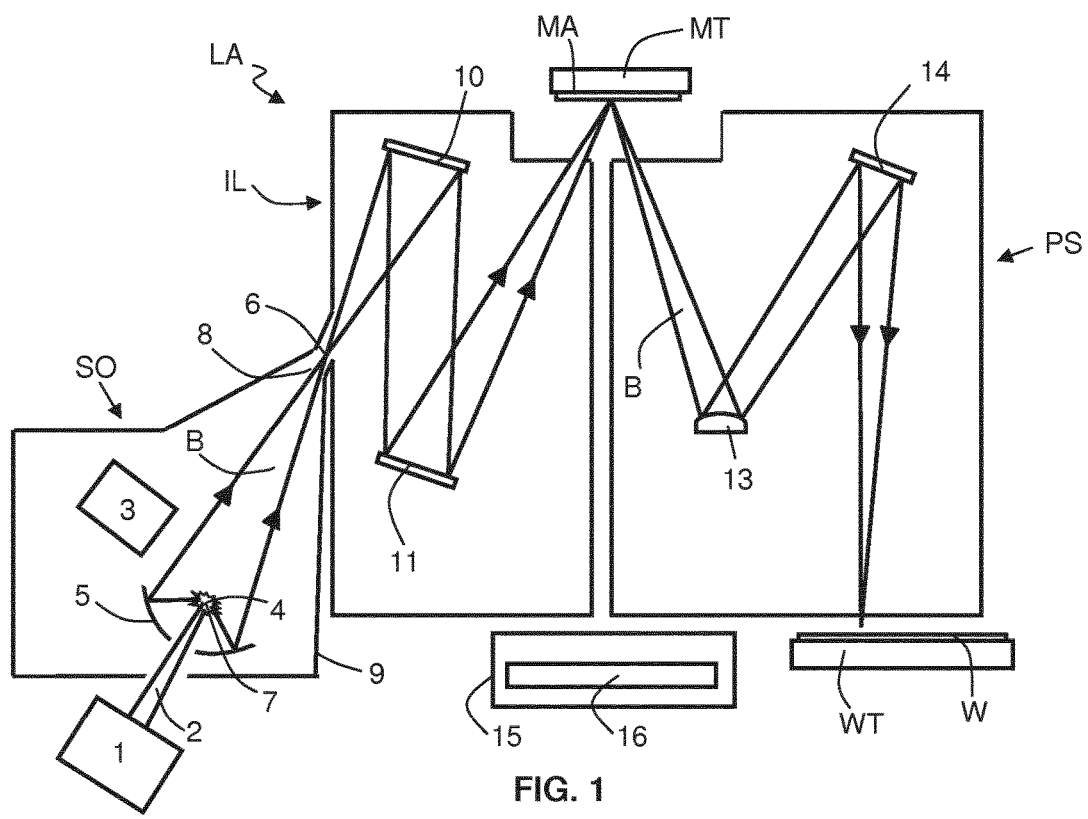
FIG. 1 depicts a lithographic system comprising a lithographic apparatus and a radiation source according to an embodiment of the invention.

FIG. 1 shows a lithographic system including an apparatus for cleaning an object according to one embodiment of the invention. The lithographic system comprises a radiation source SO and a lithographic apparatus LA. The radiation source SO is configured to generate an extreme ultraviolet (EUV) radiation beam B. The lithographic apparatus LA comprises an illumination system IL, a support structure MT configured to support a patterning device MA (e.g. a mask), a projection system PS and a substrate table WT configured to support a substrate W. The illumination system IL is configured to condition the radiation beam B before it is incident upon the patterning device MA. The projection system is configured to project the radiation beam B (now patterned by the mask MA) onto the substrate W. The substrate W may include previously formed patterns. Where this is the case, the lithographic apparatus aligns the patterned radiation beam B with a pattern previously formed on the substrate W.

The radiation source SO, illumination system IL, and projection system PS may all be constructed and arranged such that they can be isolated from the external environment. A gas at a pressure below atmospheric pressure (e.g. hydrogen) may be provided in the radiation source SO. A vacuum may be provided in illumination system IL and/or the projection system PS. A small amount of gas (e.g. hydrogen) at a pressure well below atmospheric pressure may be provided in the illumination system IL and/or the projection system PS.

The radiation source SO shown in FIG. 1 is of a type which may be referred to as a laser produced plasma (LPP) source). A laser 1, which may for example be a $CO_2$ laser, is arranged to deposit energy via a laser beam 2 into a fuel, such as tin (Sn) which is provided from a fuel emitter 3. Although tin is referred to in the following description, any suitable fuel may be used. The fuel may for example be in liquid form, and may for example be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a plasma 7 at the plasma formation region 4. Radiation, including EUV radiation, is emitted from the plasma 7 during de-excitation and recombination of ions of the plasma.

The EUV radiation is collected and focused by a near normal incidence radiation collector 5 (sometimes referred to more generally as a normal incidence radiation collector). The collector 5 may have a multilayer structure which is arranged to reflect EUV radiation (e.g. EUV radiation having a desired wavelength such as 13.5 nm). The collector 5 may have an elliptical configuration, having two ellipse focal points. A first focal point may be at the plasma formation region 4, and a second focal point may be at an intermediate focus 6, as discussed below.

The laser 1 may be separated from the radiation source SO. Where this is the case, the laser beam 2 may be passed from the laser 1 to the radiation source SO with the aid of a beam delivery system (not shown) comprising, for example, suitable directing mirrors and/or a beam expander, and/or other optics. The laser 1 and the radiation source SO may together be considered to be a radiation system.

Radiation that is reflected by the collector 5 forms a radiation beam B. The radiation beam B is focused at point 6 to form an image of the plasma formation region 4, which acts as a virtual radiation source for the illumination system IL. The point 6 at which the radiation beam B is focused may be referred to as the intermediate focus. The radiation source SO is arranged such that the intermediate focus 6 is located at or near to an opening 8 in an enclosing structure 9 of the radiation source.

The radiation beam B passes from the radiation source SO into the illumination system IL, which is configured to condition the radiation beam. The illumination system IL may include a facetted field mirror device 10 and a facetted pupil mirror device 11. The faceted field mirror device 10 and faceted pupil mirror device 11 together provide the radiation beam B with a desired cross-sectional shape and a desired angular distribution. The radiation beam B passes from the illumination system IL and is incident upon the patterning device MA held by the support structure MT. The patterning device MA reflects and patterns the radiation beam B. The illumination system IL may include other mirrors or devices in addition to or instead of the faceted field mirror device 10 and faceted pupil mirror device 11.

Following reflection from the patterning device MA the patterned radiation beam B enters the projection system PS. The projection system comprises a plurality of mirrors which are configured to project the radiation beam B onto a substrate W held by the substrate table WT. The projection system PS may apply a reduction factor to the radiation beam, forming an image with features that are smaller than corresponding features on the patterning device MA. A reduction factor of 4 may for example be applied. Although the projection system PS has two mirrors in FIG. 1, the projection system may include any number of mirrors (e.g. six mirrors).

The substrate W is loaded into the lithographic apparatus LA via a load lock 15. The load lock 15 is an enclosure into which the substrate W is loaded from an environment at atmospheric pressure in order to pass to the lower pressure environment within the lithographic apparatus LA. The substrate W is placed within the load lock 15 and the load lock 15 is sealed and pumped from atmospheric pressure to a vacuum pressure which is equal to the pressure within the lithographic apparatus LA. The substrate W is then transferred to the substrate table WT. The load lock 15 includes a substrate support 16 upon which the substrate is supported during pressure equalisation.

Figure 2:
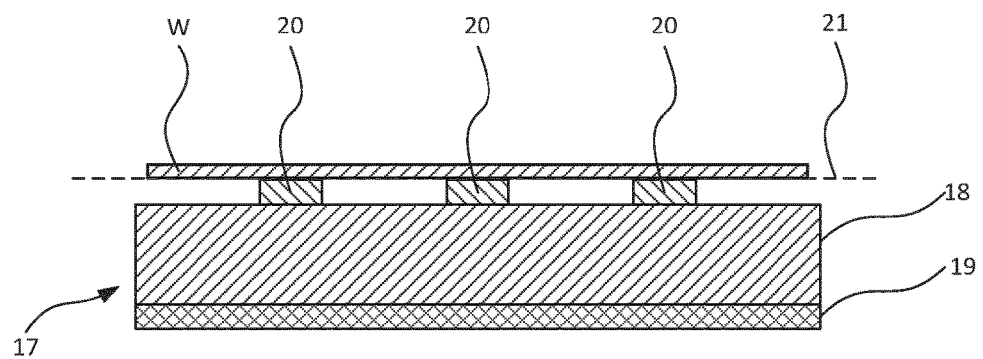
FIG. 2 depicts a part of the lithographic apparatus in more detail.

FIG. 2 shows the part of the substrate table WT in more detail. The substrate W is supported and held on the substrate table by an electrostatic clamp 17. The clamp 17 comprises a dielectric portion 18 formed from a dielectric material, and an electrode 19. A plurality of burls 20 are located on an upper surface of the dielectric portion 18. The burls 20 may be formed from a dielectric material. Upper surfaces of the burls 20 determine a plane 21 at which a lower surface of the substrate W is held. The electrode 19 is provided on an opposing surface of the dielectric portion 18 to the burls 20.

The electrode 19 is configured to be held at a voltage to generate an electrostatic clamping force between the clamp 17 and the substrate W. The voltage may be considerable. For example, the voltage may be of the order of kilovolts. The substrate W is held in plane 21 by the electrostatic clamping force when the voltage is applied to the electrode 19. During clamping the applied voltage, and more particularly the resulting electrostatic-field which is established between the clamp 17 and the substrate W, may cause a localised discharge across the gap between the substrate W and the clamp 17. This discharge may take the form of electrons being emitted from the lower surface of the substrate W, or an upper surface of the clamp. Any such discharge may lead to an instantaneous reduction in the local clamping force.

Any such emitted electrons are driven by the electrostatic-field towards the electrode 19 of the electrostatic clamp 17. However, the electrons are prevented from reaching the electrode 19 by the dielectric portion 18 which is provided over the electrode 19. The electrons instead become trapped at the surface of the dielectric portion 18. The insulating nature of the dielectric portion 18 prevents the electrons from flowing away. Any such trapped electrons therefore remain on the surface of the dielectric portion 18.

Trapped electrons may remain on the surface of the dielectric portion 18 for a significant time period, and will not be removed by normal clamp operations. Each time a wafer is clamped the electrode voltage is removed and re-applied. However, this does not cause any trapped electrons to be removed. Therefore the trapped electrons may remain for many clamping cycles. For example, a trapped electron may remain on the surface of a clamp for 1000s of clamping cycles.

The effect of any such trapped electrons will be localised to the area of the dielectric surface in which the electrons are trapped. This effect may be a reduction in the clamping force experienced by the substrate in that area due to the trapped charge screening the effect of the voltage applied to the electrode 18 from the substrate W. Alternatively, any such trapped electrons may cause a local increase in the clamping force experienced by the substrate in that area. It will be appreciated that the polarity of the clamping voltage may be reversed between clamping cycles, leading to trapped charge either reinforcing or degrading the effect of the clamping voltage, depending on the polarity of the applied clamping voltage. The location of any trapped charge corresponds to the location from which any electron was emitted or accepted, which may be randomly distributed across the surface of the substrate. During a single clamping operation a clamp may thus gradually accumulate a significant charge in a small area, or a plurality of small areas, which correspond(s) to the location or locations of electron emitters on the surface of the substrate.

Further, in normal operation a clamp is used to clamp a large number of substrates one after another. A clamp may thus gradually accumulate a large number of trapped electrons, in a large number of small areas, and a potentially significant negative charge at its surface, each clamping operation potentially resulting in electron emission from the clamped substrate. The locations of the small areas of accumulated charge would be randomly distributed about the surface of the clamp, each substrate potentially emitting electrons from random locations on their surface. The clamping of some substrates may not result in any electron emission, while the clamping of other substrates may result in a significant amount of electron emission.

Any such trapped charge could cause difficulties in substrate handling. For example, trapped charge could cause a non-uniform clamping effect. Any non-uniform clamping could cause non-uniform stress within a substrate, and result in distortions to a substrate. Further, before a substrate is clamped, as it is moved into position above a clamp, any trapped charge could cause local sticking of the substrate to the clamp, preventing the substrate from moving freely to the intended position, and again causing local stress and deformation within the substrate. Similarly, when a clamping voltage is removed, trapped charge may cause a substrate to continue to stick to the clamp.

Local stress and deformation within a substrate can lead to distortion in any pattern applied to the substrate, and subsequent alignment errors. For example, when a substrate which already has a pattern is clamped, and a second pattern is subsequently applied to the substrate, any distortion of the substrate during clamping may cause the second pattern to not overlay accurately on the first pattern.

In order to remove the charge from the surface of a clamp 17, it is known to wash the clamp with a conductive fluid. This allows the trapped electrons to be carried away. However, this causes disruption to the operation of a lithography apparatus, and may require removal of the clamp from the lithography apparatus.

It has been realised that the likelihood of electron emission occurring from the substrate W is strongly dependent on the nature and condition of the surface of the substrate W. In particular, small particles or defects (e.g. scratches) on the lower surface of the substrate W may act as electron emitters, leading to local discharges across the vacuum gap. Electron emission can occur from particles of any material (e.g. metal, silicon, fibre), and is influenced more by surface geometry than it is by the material of the surface or particle. The probability of field electron emission occurring is significantly reduced by a substrate having a smooth and flat surface. However, if a surface has sharp features, for example small particles, then the electric field is enhanced at those sharp features. For example, if the aspect ratio of a feature is increased by a factor of 10, then the electric field will also be enhanced by a factor of 10. Any such features are likely to be randomly distributed across the surface of a substrate, and are thus likely to appear in different locations on each substrate.

The conditions experienced during clamping may involve, for example, an electric field strength of around 100 V/μm across a clamping separation of around 10 μm). Further, the field enhancement factor caused by sharp features could, for example, be 20. This combination of conditions and field enhancement would generate an electric field strength of around 2000 V/μm. Such an electric field strength is known to lead to field electron emission.

It is known to clean the backside of substrates prior to clamping to remove large particles (e.g. >1 μm) which may cause local distortions in a substrate, substrate height issues, or non-parallel clamping, any of which may result in focusing issues (e.g. part of a pattern on a substrate being out of focus), and overlay errors due to local bending of the substrate. Such cleaning may be carried out by mechanical processes, such as scrubbing. However, such cleaning processes may not remove small particles. Small particles are particles which may have a dimension of less than 1 µm, for example 50 nm or 100 nm. Such small particles are likely to be stuck to a surface more strongly than larger particles. Moreover, cleaning processes which are intended to target and remove large particles may even generate small particles and scratches. For example, it is known that cleaning processes involving swabs or cloths may in fact generate many particles having a dimension of less than 0.5 µm.

In order to reduce the incidence of electron emission (and the associated negative effects) it is possible to remove or modify small particles and scratches on the surface of the substrate W prior to clamping. The removal or modification of small particles and scratches can be effected by cleaning the surface of the substrate W with a discharge. This cleaning of the surface of the substrate W, and subsequent reduction in electron emission, slows down any charge accumulation on an electrostatic clamp 17. This reduction in the rate of charge accumulation can increase the time between maintenance operations on the clamp.

Figure 3:
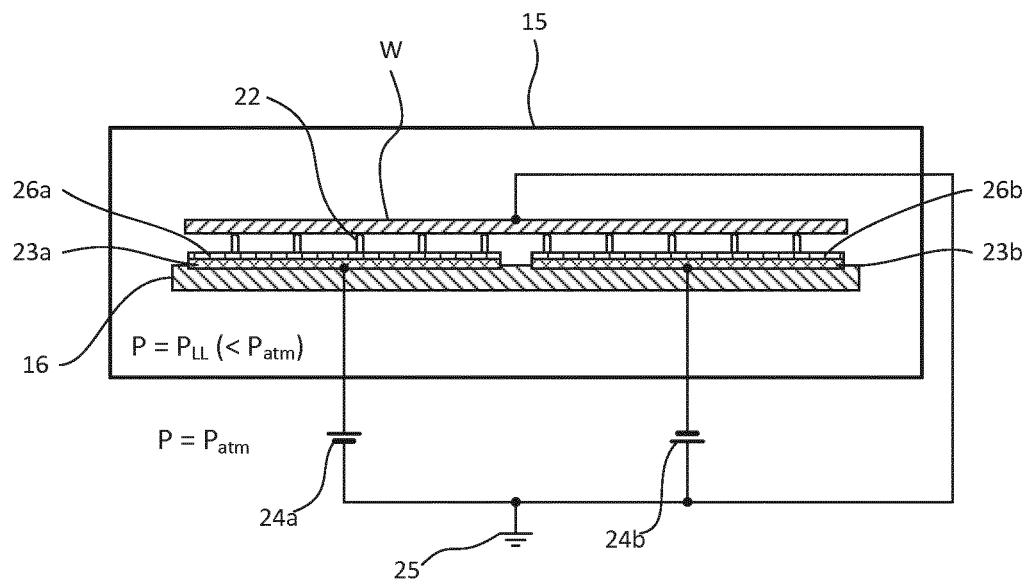
FIG. 3 depicts an apparatus according to an embodiment of the invention.

FIG. 3 shows an apparatus which can be used for discharge cleaning the surface of a substrate W. The load lock 15 and substrate support 16 of FIG. 1 are shown in more detail. The substrate support 16 is provided with a plurality of equally sized pins 22 which project from a surface of the substrate support 16. The pins 22 are arranged in array, each pin having a tip which is configured to support substrate W. The tips of each of the plurality of pins 22 together define a plane in which the lower surface of the substrate W is supported. The lower surface of the substrate W is the same surface which is supported on the burls 20 when the substrate W is held on the substrate table WT (i.e. the surface which faces the electrostatic clamp 17, and from which electrons may be emitted during clamping). While a large number of pins 22 are shown, a smaller number may be used. For example, three pins may provide adequate support for a substrate.

The substrate support 16 further comprises first and second electrodes 23a, 23b arranged below the pins 22 on the side of the substrate support 16 which is facing the substrate W. Each of the electrodes 23a, 23b extends across approximately half of the substrate support 16. The plurality of pins 22 may extend from the surface of the substrate support 16 as shown in FIG. 3. Alternatively, pins may extend through holes in the electrodes. The electrodes 23a, 23b are arranged adjacent to and separated from the plane in which the substrate W is supported. The electrodes 23a, 23b are also arranged parallel to the plane in which the substrate W is supported. The height of the pins 22 determines the separation between the substrate W and the electrodes 23a, 23b. The separation between the substrate W and the electrodes 23a, 23b may, for example, be greater than about 5 mm. The separation between the substrate W and the electrodes 23a, 23b may, for example, be less than about 20 mm. The pins 22 may be formed from a conductive material. For example, the pins may be stainless steel.

The first electrode 23a is connected to a first power supply 24a, and the second electrode 23b is connected to a second power supply 24b. The first and second power supplies 24a, 24b are configured to provide voltages relative to a common ground 25 which are substantially equal in magnitude but opposite in polarity (or sign) from one another. For example, the first power supply 24a may provide a voltage of +500 V to the first electrode 23a, and the second power supply 24b may provide a voltage of −500 V to the second electrode 23b. The substrate W may also be connected to the common ground 25, such that the electrodes 23a, 23b are held at voltages relative to the substrate W. The pins 22 may provide a connection between the common ground 25 and the substrate W. Alternatively, the substrate may be capacitively coupled to ground. In such an arrangement, any current flowing to or from the electrodes 23a, 23b, will flow via the other of the electrodes 23a, 23b, rather than directly to ground.

The electrodes 23a, 23b are each provided with a respective resistive layer 26a, 26b, which covers the upper surface of each of the electrodes 23a, 23b. The upper surfaces of the electrodes 23a, 23b, while each covered with a respective resistive layer 26a, 26b, are still in electrical communication with the upper surface of the substrate support (i.e. the surface of the substrate support which faces the lower surface of the substrate W). This ensures that there is a current path from the upper surface of the substrate support 16 to the electrodes 23a, 23b. As such, and unlike a substrate which is clamped by an the electrostatic clamp 17 as illustrated in FIG. 2, any electrons which are emitted from the lower surface of the substrate W are allowed to flow to the electrodes 23a, 23b, rather than becoming trapped on the surface of the substrate support.

Figure 4:
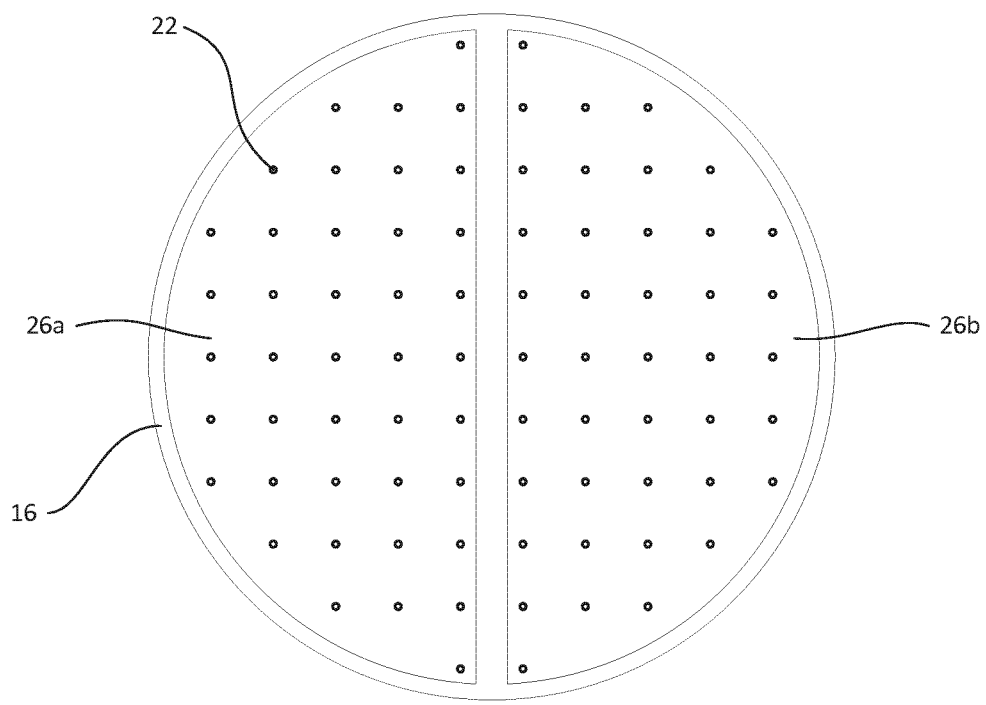
FIG. 4 depicts an apparatus according to an embodiment of the invention.

FIG. 4 shows the substrate support 16 from above. The substrate support 16 is circular, and is of a similar size to the substrate with which it is intended to be used. The substrate W may, for example, be a circular wafer with a diameter of 300 mm. The resistive layers 26a, 26b each cover approximately half of the substrate support 16. It will be appreciated that the electrodes 23a, 23b are located below the resistive layers 26a, 26b, and are thus not visible in FIG. 4. The plurality of pins 22 are distributed across the surface of the substrate support 16. The substrate support 16 may alternatively be larger than the substrate it is intended to support.

As described above, the load lock 15 allows the substrate W to pass from an environment at atmospheric pressure to the lower pressure environment within the projection system PS. During normal use, the load lock 15 is sealed and pumped from atmospheric pressure to a vacuum pressure which is equal to the pressure within the projection system PS. The pressure within the load lock 15 may thus be readily controlled so as to be below atmospheric pressure.

The substrate W to be cleaned is positioned on the pins 22 within the load lock 15 and the pressure within the load lock is reduced to a pressure $P_{LL}$ which is below atmospheric pressure $P_{atm}$. The pressure $P_{LL}$ may, for example, be below 100 around mbar. The pressure $P_{LL}$ may, for example, be above around 1 mbar.

Once the load lock pressure $P_{LL}$ is at the target pressure, voltages are applied to the electrodes 23a, 23b. The voltages applied across the gap between the electrodes 23a, 23b and the substrate W cause an electrostatic-field to be established. The combination of the low pressure and the electrostatic-field causes the gas within the gap to ionise, forming an electric discharge. This discharge allows current to flow between the electrodes and the substrate W.

The discharge may cause the particles (which are described above as electron emitters) to evaporate, or for sharp tips of particles to become more rounded. Similarly, the discharge may cause sharp edges of any surface scratches to become more rounded. Any flow or current between the electrodes and the substrate is focused upon any features with high aspect ratios (e.g. sharp edges), for the same reasons which those features may emit electrons when clamped. That is, the field enhancement effect of any high aspect ratio surface features causes the particles or scratches to emit electrons, igniting the discharge. This flow of current through particles or scratches on the surface of the substrate W also causes significant local heating due to the high current density. This local heating may, for example, cause the particle to evaporate, and be removed from the surface of the substrate W entirely. Alternatively, the local heating may cause the emission characteristics of any particles or scratches to be modified such that they are less likely to emit electrons. For example, sharp edges of features which are responsible for field enhancement which causes electron emission may be partially rounded by the high current density flowing through those edges. This rounding may result in a reduced field enhancement effect, and reduced emission in during clamping. Electron emitters which are modified in this way may be considered to be neutralised.

In addition to the local heating caused by high current density, as described above, the formation of a discharge causes ions to be generated between the electrodes 23a, 23b, and the substrate W. These ions may bombard the surface of the substrate W, and may further contribute to the cleaning effect described above.

The conditions required to remove or modify the electron emitters may vary depending upon the nature and number of the emitters. A number of properties cooperate to provide suitable conditions for discharge cleaning. For example, the voltage applied, the duration for which the voltage is applied, the pressure and the separation between the electrode and the substrate all cooperate to provide suitable conditions.

The voltage applied may be an AC or a DC voltage. The voltage applied may be around ±500 V (i.e. +500 V and −500 V as described above). The voltage applied may be up to around ±1 kV. The voltage applied may be greater than around ±200 V.

Where a DC voltage is applied, the voltages may be applied in turn to each of the two electrodes 23a, 23b. That is, a positive voltage may be applied to the first electrode 23a, and a negative voltage may be applied to the second electrode 23b. The voltages may then be reversed, changing the direction of current flow. This would allow all parts of the substrate to act as an electron emitter during one of the directions of current flow. For example, a DC voltage may be applied in each direction for around 2 seconds. A voltage may be applied for longer or shorter times depending on the number of electron emitters on a surface. It will be appreciated that the longer the duration for which the voltage is applied, the more electron emitters will be modified or removed.

Where an AC voltage is applied, the voltage applied to each of the electrodes 23a, 23b may simply be the same voltage in opposite phases. The direction of current flow will thus reverse in each AC cycle. One or two cycles may provide sufficient duration to remove electron emitters from the surface of the substrate. For example, where a 50 Hz supply is used, the AC voltage may be applied for as little as around 2-4 milliseconds.

The current density may be large where discharge does occur. For example, the current density may be around 10 A/mm$^2$ at a discharge location. The area over which this current may flow may, for example, be around 1 μm$^2$. The current flow will thus be small (e.g. around 10 μA per location). A substrate may, for example, have around 10000 such discharge locations (i.e. electron emitters) in each half.

When a voltage is applied between the electrodes 23a, 23b and the substrate a total current of around 100 mA may flow to the substrate for each polarity of voltage applied (i.e. 100 mA may flow from the first electrode 23a to a first half of the substrate when a first polarity of voltage is applied, and 100 mA may flow from the second electrode 23b to a second half of the substrate when a second polarity of voltage is applied).

As described above the pressure in the load lock $P_{LL}$ during the formation of a discharge may be, for example, less than around 100 mbar. The pressure $P_{LL}$ may be, for example, greater than around 1 mbar. The gas present during the formation of a discharge may be any gas, for example air.

The electrodes 23a, 23b are described as being two separate electrodes. However, in embodiments of the invention, different numbers of electrodes may be used. For example, a single electrode may be used. Alternatively, a greater number of electrodes may be used. For example, four or more electrodes may be used.

It will be appreciated that where a single electrode is used a current path should be provided from the substrate to the power supply. The substrate should thus be grounded where only a single electrode is used. However, it will also be appreciated that where a plurality of electrodes are used the substrate W may also be grounded (as shown in FIG. 3). However, as described in more detail above, where two or more electrodes are used with different polarities (i.e. one positive and one negative), the ground connection to the substrate W may be omitted.

The provision of the resistive layers 26a, 26b on the electrodes 23a, 23b, limits the flow of current when the voltage is applied to the electrodes 23a, 23b. A large flow of current may cause damage to the substrate. It will be appreciated that in the absence of any resistive layers, an applied voltage between the electrode and the substrate may cause a large instantaneous current to flow. This may lead to large currents flowing within the substrate (e.g. from the discharge location to a connection to ground, or to another discharge location). Such currents flowing within the substrate may cause damage to circuits or semiconductor components which may already be defined on the substrate by earlier processing steps.

More particularly, the provision of the resistive layers 26a, 26b on the electrodes 23a, 23b, locally limits the flow of current when the voltage is applied to the electrodes 23a, 23b. Where a discharge does occur between the substrate W and one of the electrodes 23a, 23b, the high resistance of the resistive layers 26a, 26b will cause a local voltage drop at the surface of the resistive layer 26a, 26b in the region of the discharge, preventing significant current from flowing, and thus reducing possible damage to the substrate W. However, the remainder of the surface of the resistive layer 26a, 26b will be maintained at the applied voltage, allowing further discharges to occur at the locations of other electron emitters on the surface of the substrate W.

The resistive layers 26a, 26b may be arranged such that the total resistance of each resistive layer 26a, 26b is greater than around $10^5 \Omega$, in order to provide adequate protection from high current flow. For example, the substrate support 16 may have a total area of around 0.1 m$^2$. Each electrode 23a, 23b (and hence each resistive layer 26a, 26b) would thus have an area of around 0.05 m$^2$. The resistive layers 26a, 26b may, for example, be around 1 mm in thickness. Such a resistive layer should therefore have a volume resistivity of the order of at least $10^6$ Ω·m in order to achieve a total resistance of around $10^5 \Omega$. The resistive layers 26a, 26b may be arranged such that the total resistance of each resistive layer 26a, 26b is less than around $10^{12}\Omega$ in order to provide a current path from the surface of the substrate support 16 to the electrodes 23a, 23b. Such a resistive layer should therefore have a volume resistivity of less than around $10^{14}$ $\Omega \cdot m$ in order to achieve a total resistance of around $10^{12}\Omega$. The resistive layers 26a, 26b may, for example, be formed from aluminium nitride.

In some embodiments the resistive layers 26a, 26b may be omitted. The power supplies may be arranged so as to produce only a limited current output. Alternatively, the power supplies may be arranged to have a large output impedance, which effectively limits the maximum output current to a safe level. It will be appreciated that a power supply having a large output impedance will cause the voltage applied to an entire electrode to be reduced in the event that a significant discharge occurs at a point on the electrode, reducing the likelihood of damage occurring to the substrate. Such a reduction in voltage may also reduce the likelihood that discharges will occur at other regions of the electrode.

In a further alternative, the power supplies may be modulated so as to limit the energy output (e.g. PWM controlled), reducing the likelihood of damage by controlling the energy output. Where a switched or pulsed voltage is applied, each switching of the applied voltage may cause an established discharge to be extinguished at a first location, and reignited at a second location.

The provision of the substrate cleaning apparatus within the load lock 15, as described above, conveniently allows the substrate W to be cleaned during an existing processing and transportation step. Moreover, the low pressure conditions present in a load lock 15 may provide suitable discharge formation conditions. The load lock is thus an example of a low pressure chamber in which the substrate W can be cleaned. Furthermore, cleaning the substrate W immediately prior to it being clamped within a lithographic apparatus maximises the effect of the cleaning (i.e. by minimising the risk of exposure to further contaminants prior to clamping).

However, in alternative embodiments the substrate cleaning apparatus may be located within another part of a lithographic apparatus or lithographic system. For example the substrate cleaning apparatus may be located within a dedicated substrate cleaning chamber. Alternatively, the substrate cleaning apparatus may be arranged as a separate tool which is used prior to loading into a load lock.

In an embodiment, the invention may be configured without a chamber which encloses the substrate for cleaning. For example, a substrate may be arranged to be adjacent to an opening in a low pressure chamber, with a seal provided around the opening, the seal sealing against the surface of the substrate. In such an arrangement, the surface of the substrate may be exposed to the low pressure within the chamber, and a discharge generated adjacent to the surface, without the entire substrate being enclosed within the low pressure chamber. It will be appreciated that a substrate may not be able to withstand high differential pressures. Such a substrate should not therefore be exposed to high differential pressures. Further, where any such differential pressure environment is used, support may be provided for a substrate so as to prevent deformation which may cause damage to the substrate.

In an embodiment the invention may be configured to clean a surface of a reticle or mask. The substrate W is thus an example of an object which may be cleaned within an object cleaning apparatus according to an embodiment of the invention. Further, the substrate support 16 described above is an example of an object support which supports an object within an object cleaning apparatus. In an alternative embodiment, the object support may be configured to support a reticle or mask, and may therefore be non-circular (e.g. square or rectangular).

In an embodiment, the invention may form part of a mask inspection apparatus. The mask inspection apparatus may use EUV radiation to illuminate a mask and use an imaging sensor to monitor radiation reflected from the mask. Images received by the imaging sensor are used to determine whether or not defects are present in the mask. The mask inspection apparatus may include optics (e.g. mirrors) configured to receive EUV radiation from an EUV radiation source and form it into a radiation beam to be directed at a mask. The mask inspection apparatus may further include optics (e.g. mirrors) configured to collect EUV radiation reflected from the mask and form an image of the mask at the imaging sensor. The mask inspection apparatus may include a processor configured to analyse the image of the mask at the imaging sensor, and to determine from that analysis whether any defects are present on the mask. The processor may further be configured to determine whether a detected mask defect will cause an unacceptable defect in images projected onto a substrate when the mask is used by a lithographic apparatus.

In an embodiment, the invention may form part of a metrology apparatus. The metrology apparatus may be used to measure alignment of a projected pattern formed in resist on a substrate relative to a pattern already present on the substrate. This measurement of relative alignment may be referred to as overlay. The metrology apparatus may for example be located immediately adjacent to a lithographic apparatus and may be used to measure the overlay before the substrate (and the resist) has been processed.

In an embodiment, there is provided an apparatus for cleaning an object, the apparatus comprising: an object support for supporting the object; a low pressure chamber for exposing a first surface of the object to a low pressure when the object is arranged on the object support; an electrode arranged adjacent to and separated from the first surface of the object when the object is arranged on the object support, the electrode being in electrical communication with a surface of the object support which is adjacent the first surface of the object; and a power supply arranged to apply a voltage between the electrode and the object; thereby generating a discharge between the object and the electrode.

In an embodiment, the object support is arranged to support the object within the chamber. In an embodiment, the electrode is provided with a resistive layer on the surface of the object support which is adjacent the first surface of the object. In an embodiment, the resistive layer has a resistance of greater than around $10^5\Omega$. In an embodiment, the resistive layer has a resistance of less than around $10^{12}\Omega$. In an embodiment, the resistive layer has a resistivity of greater than around $10^6$ $\Omega \cdot m$. In an embodiment, the resistive layer has a resistivity of less than around $10^{14}$ $\Omega \cdot m$. In an embodiment, the magnitude of the voltage is greater than about 200 V. In an embodiment, the magnitude of the voltage is less than about 1000 V. In an embodiment, the separation between the object support and the first surface of the object when the object is arranged on the object support is greater than about 5 mm. In an embodiment, the apparatus further comprises a second electrode, wherein a power supply is arranged to apply a first voltage between the first electrode and the object and a second voltage between the second electrode and the object. In an embodiment, the second voltage is of opposite sign to the first voltage. In an embodiment, the second voltage is of substantially equal magnitude to the first voltage. In an embodiment, the low pressure is less than about 100 mbar. In an embodiment, the low pressure is greater than about 1 mbar.

In an embodiment, there is provided a lithographic tool comprising an apparatus for cleaning an object as described herein. In an embodiment, the low pressure chamber is a load lock of the lithographic tool.

In an embodiment, there is provided a method of cleaning an object, the method comprising: providing the object to be cleaned; supporting the object; exposing a first surface of the object to be cleaned to a low pressure; providing an electrode adjacent to and separated from the first surface of the object; applying a voltage between the electrode and the object so as to generate a discharge between the object and the electrode; and providing a current path between the electrode and the first surface of the object.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. An apparatus for cleaning an object, the apparatus comprising:
   an object support configured to support the object;
   a low pressure chamber configured to expose a first surface of the object to a low pressure when the object is arranged on the object support;
   an electrode arranged adjacent to and separated from the first surface of the object when the object is arranged on the object support, the electrode being in electrical communication with a surface of the object support which is adjacent the first surface of the object; and
   a power supply arranged to apply a voltage between the electrode and the object to generate an ionizing electric discharge between the object and the electrode,
   wherein the electrode has a resistive layer on the surface of the object support which is adjacent the first surface of the object.

2. An apparatus according to claim 1, wherein the object support is arranged to support the object within the chamber.

3. An apparatus according to claim 1, wherein the resistive layer has a resistance of greater than around $10^5 \Omega$.

4. An apparatus according to claim 1, wherein the resistive layer has a resistance of less than around $10^{12} \Omega$.

5. An apparatus according to claim 1, wherein the resistive layer has a resistivity of greater than around $10^6$ $\Omega \cdot m$.

6. An apparatus according to claim 5, wherein the resistive layer has a resistivity of less than around $10^{14}$ $\Omega \cdot m$.

7. An apparatus according to claim 1, wherein the magnitude of the voltage is greater than about 200 V.

8. An apparatus according to claim 7, wherein the magnitude of the voltage is less than about 1000 V.

9. An apparatus according to claim 1, wherein a separation between the electrode and the first surface of the object when the object is arranged on the object support is greater than about 5 mm.

10. An apparatus according to claim 1, further comprising a second electrode, wherein a power supply is arranged to apply a first voltage between the first electrode and the object and a second voltage between the second electrode and the object.

11. An apparatus according to claim 10, wherein the second voltage is of opposite sign to the first voltage.

12. An apparatus according to claim 11, wherein the second voltage is of substantially equal magnitude to the first voltage.

13. An apparatus according to claim 1, wherein the low pressure is less than about 100 mbar.

14. An apparatus according to claim 13, wherein the low pressure is greater than about 1 mbar.

15. A lithographic tool comprising an apparatus for cleaning an object according to claim 1.

16. A lithographic tool according to claim 15, wherein the low pressure chamber is a load lock of the lithographic tool.

17. A method of cleaning an object, the method comprising:
   supporting the object to be cleaned on an object support;
   exposing a first surface of the object to be cleaned to a low pressure;
   providing an electrode adjacent to and separated from the first surface of the object, wherein the electrode has a resistive layer on a surface of the object support which is adjacent the first surface of the object;
   applying a voltage between the electrode and the object so as to generate an ionizing electric discharge between the object and the electrode; and
   providing a current path between the electrode and the first surface of the object.

18. The method of claim 17, wherein the resistive layer has a resistance of greater than around $10^5 \Omega$ and less than around $10^{12} \Omega$.

19. The method of claim 17, wherein the resistive layer has a resistivity of greater than around $10^6$ Ω·m and less than around $10^{14}$ Ω·m.

20. The method of claim 17, wherein the magnitude of the voltage is greater than about 200 V and less than about 1000 V.

21. The method of claim 17, wherein a separation between the electrode and the first surface of the object is greater than about 5 mm.

22. The method of claim 17, further comprising applying a first voltage between the first electrode and the object and a second voltage between a second electrode and the object.

* * * * *